(12) United States Patent
Hsieh et al.

(10) Patent No.: US 11,469,738 B1
(45) Date of Patent: Oct. 11, 2022

(54) OSCILLATING DEVICE

(71) Applicant: TXC CORPORATION, Taipei (TW)

(72) Inventors: Wan-Lin Hsieh, Ping Cheng (TW);
Yu-Liang Chen, Ping Cheng (TW);
Erh-Shuo Hsu, Ping Cheng (TW);
Chih-Hsun Chen, Ping Cheng (TW);
Sheng-Hsiang Kao, Ping Cheng (TW)

(73) Assignee: TXC CORPORATION, Taipei (TW)

( * ) Notice: Subject to any disclaimer, the term of this patent is extended or adjusted under 35 U.S.C. 154(b) by 0 days.

(21) Appl. No.: 17/379,500

(22) Filed: Jul. 19, 2021

(51) Int. Cl.
*H03H 9/19* (2006.01)
*H03B 5/04* (2006.01)
*H03H 9/02* (2006.01)

(52) U.S. Cl.
CPC ............... *H03H 9/19* (2013.01); *H03B 5/04* (2013.01); *H03H 9/02102* (2013.01)

(58) Field of Classification Search
CPC ........................................................ H03H 9/19
USPC ......................................................... 331/158
See application file for complete search history.

(56) References Cited

U.S. PATENT DOCUMENTS

| | | | | |
|---|---|---|---|---|
| 4,575,690 A | * | 3/1986 | Walls | H03B 5/32 331/116 R |
| 5,442,146 A | * | 8/1995 | Bell | G01P 15/097 310/321 |
| 5,512,864 A | * | 4/1996 | Vig | H03B 5/32 331/162 |
| 2017/0179772 A1 | * | 6/2017 | Asanuma | H02J 7/025 |
| 2018/0088160 A1 | * | 3/2018 | Maki | H03K 21/023 |
| 2018/0091158 A1 | * | 3/2018 | Sudo | H03L 7/18 |
| 2021/0091748 A1 | * | 3/2021 | Kubena | H03B 5/366 |

* cited by examiner

*Primary Examiner* — Joseph Chang
(74) *Attorney, Agent, or Firm* — Birch, Stewart, Kolasch & Birch, LLP

(57) ABSTRACT

An oscillating device includes a first quartz crystal resonator, a driving circuit, a first buffer, an attenuator, a second quartz crystal resonator, and a second buffer. The first quartz crystal resonator and the second quartz crystal resonator respectively have a first resonant frequency and a second resonant frequency. The driving circuit drives the first quartz crystal resonator to generate a first oscillating signal having the first resonant frequency. The first buffer generates a first clock signal in response to the first oscillating signal. The attenuator reduces the wave swing of the first clock signal to generate an attenuated signal. The second quartz crystal resonator rectifies the attenuated signal to generate a second oscillating signal having the second resonant frequency. The second buffer generates a second clock signal in response to the second oscillating signal.

11 Claims, 7 Drawing Sheets

OSCILLATING DEVICE

BACKGROUND OF THE INVENTION

Field of the Invention

The present invention relates to an oscillating device, particularly to an oscillating device with reduced acceleration sensitivity and phase noise.

Description of the Related Art

Electronic devices often include an oscillator to provide an oscillating signal for use as a clock source. The oscillating signal can be controlled by a resonator which requires some form of excitation signal to sustain oscillations.

The operation of an oscillator, controlled by the resonator, may be affected by age and certain environmental conditions such as temperature and, of particular interest here, acceleration. When an oscillator is subjected to acceleration, the frequency of the oscillating signal it produces may be altered. The change in frequency is proportional to the magnitude of the acceleration and dependent on direction, giving rise to an acceleration sensitivity vector. A time variable acceleration, for example vibration, can cause frequency modulation of the oscillator's frequency. Reducing the sensitivity of such oscillators to alterations of frequency due to acceleration is therefore desirable in order to produce a stable and pure frequency output from an oscillator.

To overcome the abovementioned problems, the present invention provides an oscillating device, so as to solve the afore-mentioned problems of the prior art.

SUMMARY OF THE INVENTION

The present invention provides an oscillating device, which reduces acceleration sensitivity and phase noise.

In an embodiment of the present invention, an oscillating device includes a first quartz crystal resonator, a driving circuit, a first buffer, an attenuator, a second quartz crystal resonator, and a second buffer. The first quartz crystal resonator and the second quartz crystal resonator respectively have a first resonant frequency and a second resonant frequency. The driving circuit is coupled to the first quartz crystal resonator. The driving circuit is configured to drive the first quartz crystal resonator to generate a first oscillating signal having the first resonant frequency. The first buffer is coupled to the driving circuit and the first quartz crystal resonator and configured to receive the first oscillating signal. The first buffer is configured to isolate from a load variation behind the first quartz crystal and the driving circuit to generate a first clock signal in response to the first oscillating signal. The attenuator is coupled to the first buffer and configured to receive the first clock signal. The attenuator is configured to reduce the wave swing of the first clock signal to generate an attenuated signal. The second quartz crystal resonator is coupled to the attenuator and configured to receive and rectify the attenuated signal to generate a second oscillating signal having the second resonant frequency. The second buffer is coupled to the second quartz crystal resonator and configured to receive the second oscillating signal. The second buffer is configured to isolate from a load variation behind the first quartz crystal, the driving circuit, the attenuator, and the second quartz crystal resonator to generate a second clock signal in response to the second oscillating signal.

In an embodiment of the present invention, the driving circuit and the first buffer are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

In an embodiment of the present invention, the driving circuit, the first buffer, and the second buffer are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

In an embodiment of the present invention, the driving circuit is an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

In an embodiment of the present invention, the driving circuit and the second buffer are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

In an embodiment of the present invention, the driving circuit, the first buffer, and the attenuator are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

In an embodiment of the present invention, the driving circuit, the first buffer, the second buffer, and the attenuator are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

In an embodiment of the present invention, the oscillating device further includes an electric switch with an end thereof coupled to the first buffer and another end of the electric switch is coupled to the attenuator or an output terminal.

In an embodiment of the present invention, the driving circuit, the first buffer, the second buffer, the attenuator, and the electric switch are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

In an embodiment of the present invention, the driving circuit, the first buffer, the attenuator, and the electric switch are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

In an embodiment of the present invention, the driving circuit, the first buffer and the electric switch are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

To sum up, the oscillating device filters out the oscillating signal to generate the clock signal with two quartz crystal resonators, thereby reducing acceleration sensitivity and phase noise.

DETAILED DESCRIPTION OF THE INVENTION

Figure 1:
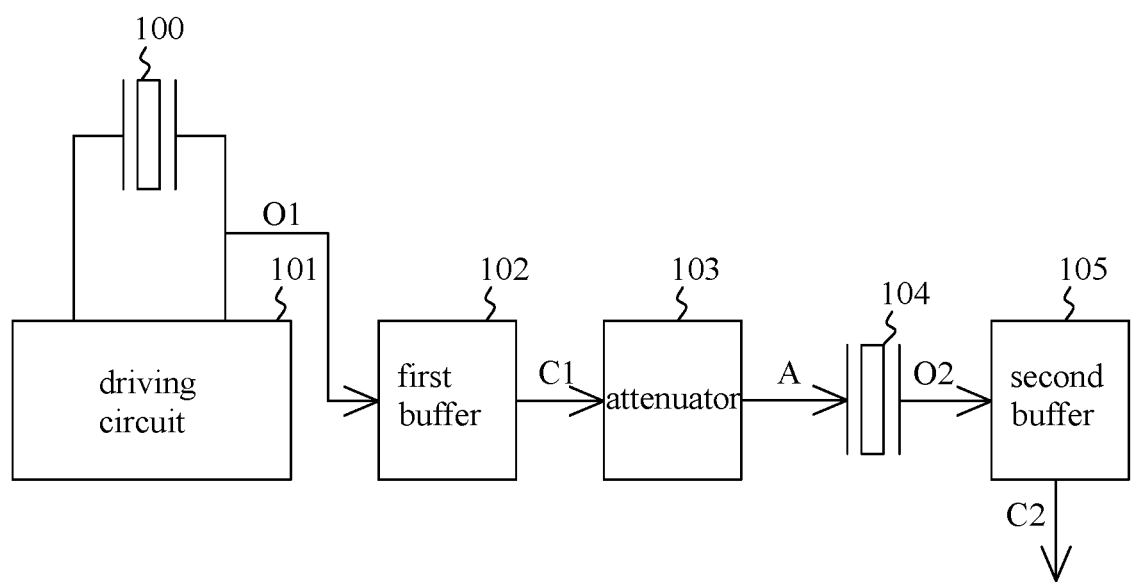
FIG. 1 is a diagram schematically illustrating an oscillating device according to a first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, an oscillating device will be provided. The oscillating device filters out an oscillating signal to generate a clock signal with two quartz crystal resonators, thereby reducing acceleration sensitivity and phase noise.

FIG. 1 is a diagram schematically illustrating an oscillating device according to a first embodiment of the present invention. Referring to FIG. 1, the oscillating device 1 includes a first quartz crystal resonator 100, a driving circuit 101, a first buffer 102, an attenuator 103, a second quartz crystal resonator 104, and a second buffer 105. The first quartz crystal resonator 100 has a first resonanat frequency. The second quartz crystal resonator 104 has a second resonant frequency. The first resonanat frequency may be different from the second resonant frequency. Preferably, the first resonanat frequency is similar to the second resonant frequency. Alternatively, the first quartz crystal resonator 100 and the second quartz crystal resonator 104 have the same resonant frequency without using any feedback circuit. The driving circuit 101 is coupled to the first quartz crystal resonator 100. The first buffer 102 is coupled to the driving circuit 101 and the first quartz crystal resonator 100. The attenuator 103 is coupled to the first buffer 102. The second quartz crystal resonator 104 is coupled to the attenuator 103. The second buffer 105 is coupled to the second quartz crystal resonator 104.

In the operation of the oscillating device 1, the driving circuit 101 drives the first quartz crystal resonator 100 to generate a first oscillating signal O1 having the first resonant frequency. The first buffer 102 receives the first oscillating signal O1. The first buffer 102 isolates from a load variation behind the first quartz crystal 100 and the driving circuit 101 to generate a first clock signal C1 in response to the first oscillating signal O1. The attenuator 103 receives the first clock signal C1. The attenuator 103 reduces the wave swing of the first clock signal C1 to generate an attenuated signal A. The second quartz crystal resonator 104 receives and rectifies the attenuated signal A to generate a second oscillating signal O2 having the second resonant frequency. The second buffer 105 receives the second oscillating signal O2. The second buffer 105 isolates from a load variation behind the first quartz crystal 100, the driving circuit 101, the attenuator 103, and the second quartz crystal resonator 104 to generate a second clock signal C2 in response to the second oscillating signal O2.

Figure 2:
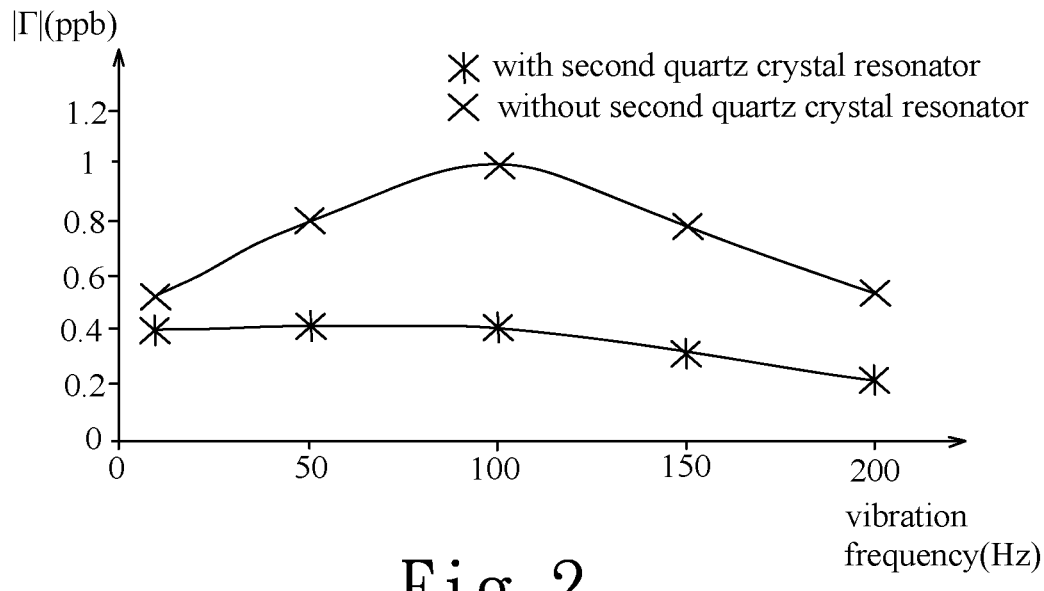
FIG. 2 is a diagram schematically illustrating curves of acceleration sensitivity versus vibration frequency according to an embodiment of the present invention.
Figure 3:
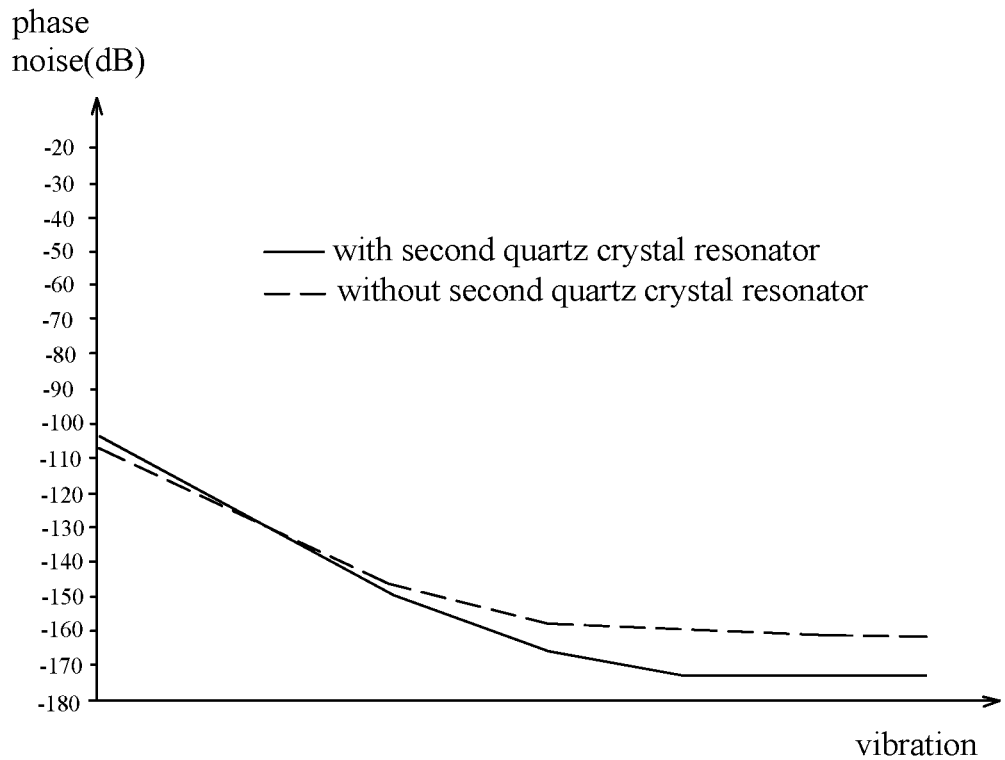
FIG. 3 is a diagram schematically illustrating curves of phase noise versus vibration frequency according to an embodiment of the present invention.

FIG. 2 is a diagram schematically illustrating curves of acceleration sensitivity versus vibration frequency according to an embodiment of the present invention. FIG. 3 is a diagram schematically illustrating curves of phase noise versus vibration frequency according to an embodiment of the present invention. Referring to FIG. 1, FIG. 2, and FIG. 3, parameters in FIG. 2 and FIG. 3 are defined in equations (1) and (2).

$$|\Gamma| = \sqrt{\Gamma_x^2 + \Gamma_y^2 + \Gamma_z^2} \quad (1)$$

$$\Gamma_i = \frac{2f_v \times 10^{\left(\frac{I_i(f_v)}{20}\right)}}{a_i \times v_o} \quad (2)$$

i represents the position of the oscillating device 1. $\Gamma_i$ represents the acceleration sensitivity of i. $\Gamma_x$ represents the acceleration sensitivity of $\Gamma_i$ in x direction. $\Gamma_y$ represents the acceleration sensitivity of $\Gamma_i$ in y direction. $\Gamma_z$ represents the acceleration sensitivity of $\Gamma_i$ in z direction. $f_v$ represents the vibration frequency of the oscillating device 1. $I_i(f_v)$ represents a power ratio at the vibration frequency. $a_i$ represents the acceleration of i. $V_o$ represents the frequency of the second clock signal C2. As illustrated in FIG. 1, FIG. 2, and FIG. 3, the acceleration sensitivity and the phase noise of the oscillating device 1 with the second quartz crystal resonator 104 are respectively lower than the acceleration sensitivity and the phase noise of the oscillating device without the second quartz crystal resonator.

Figure 4:
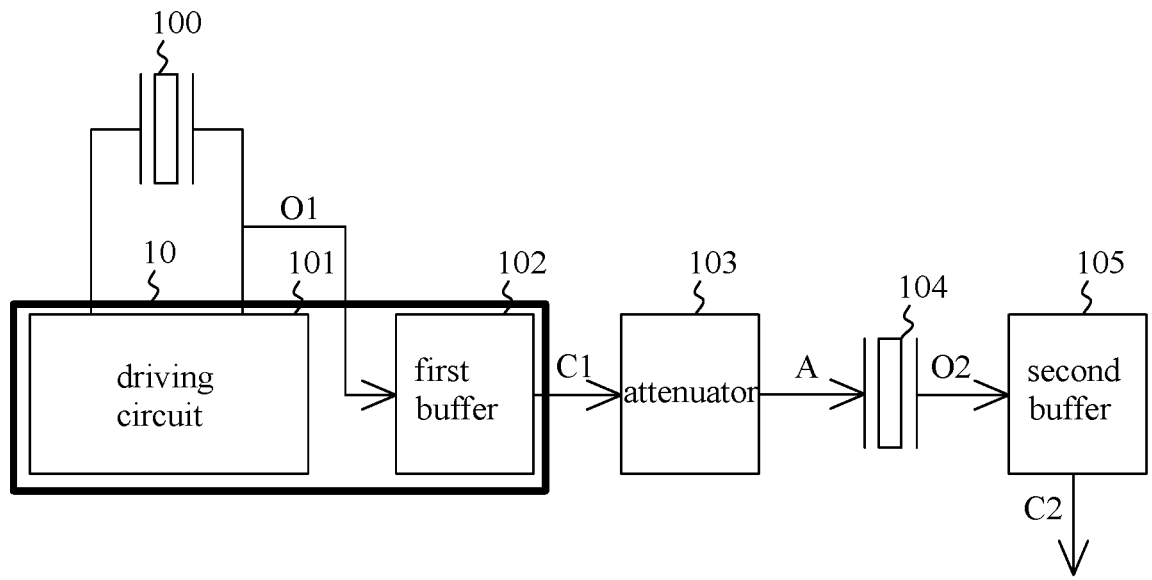
FIG. 4 is a diagram schematically illustrating an oscillating device according to a second embodiment of the present invention.

FIG. 4 is a diagram schematically illustrating an oscillating device according to a second embodiment of the present invention. Referring to FIG. 1 and FIG. 4, the driving circuit 101 and the first buffer 102 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

Figure 5:
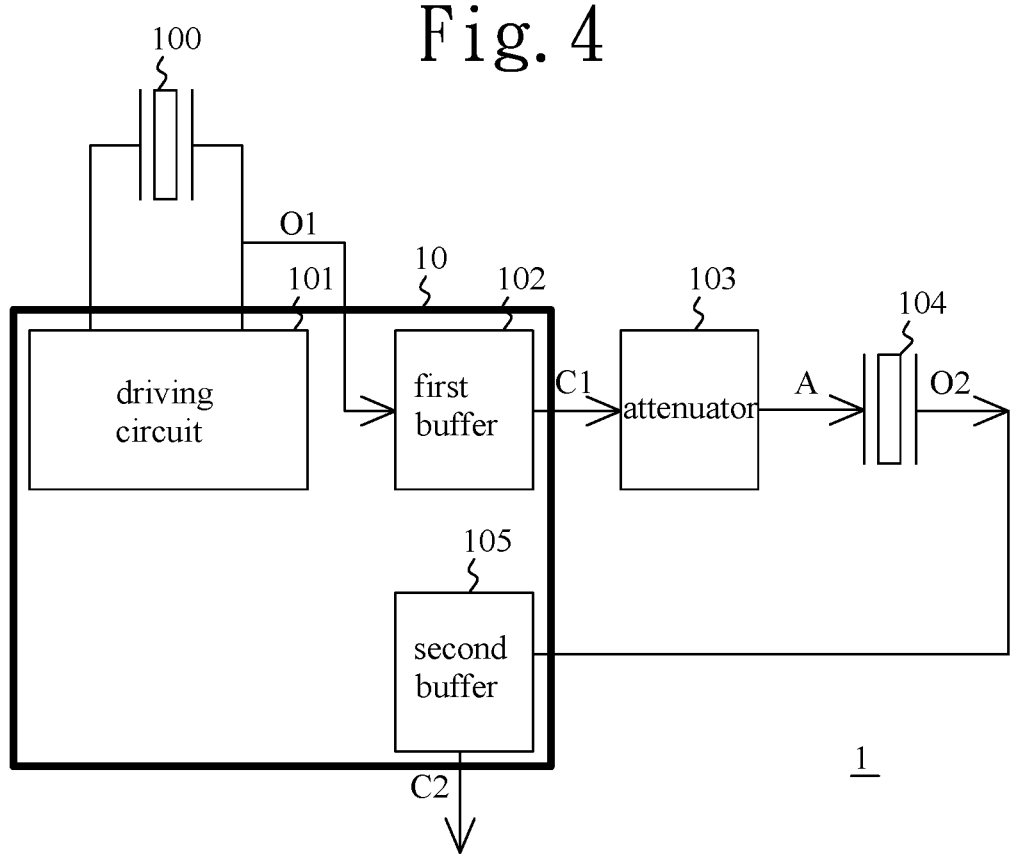
FIG. 5 is a diagram schematically illustrating an oscillating device according to a third embodiment of the present invention.

FIG. 5 is a diagram schematically illustrating an oscillating device according to a third embodiment of the present invention. Referring to FIG. 1 and FIG. 5, the driving circuit 101, the first buffer 102, and the second buffer 105 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

Figure 6:
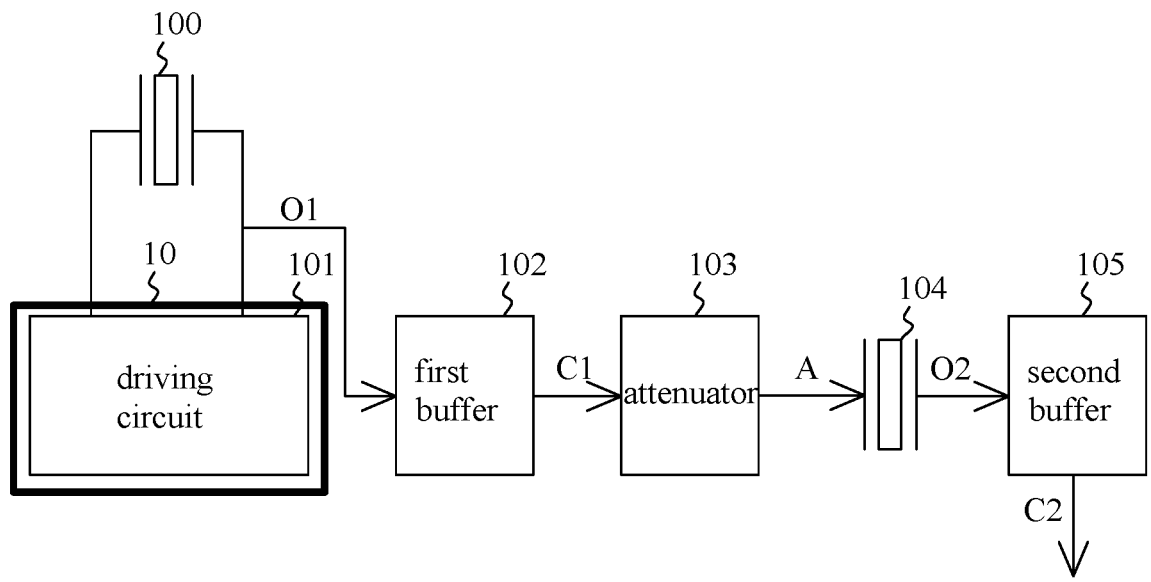
FIG. 6 is a diagram schematically illustrating an oscillating device according to a fourth embodiment of the present invention.

FIG. 6 is a diagram schematically illustrating an oscillating device according to a fourth embodiment of the present invention. Referring to FIG. 1 and FIG. 6, the driving circuit 101 may be implemented with an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

Figure 7:
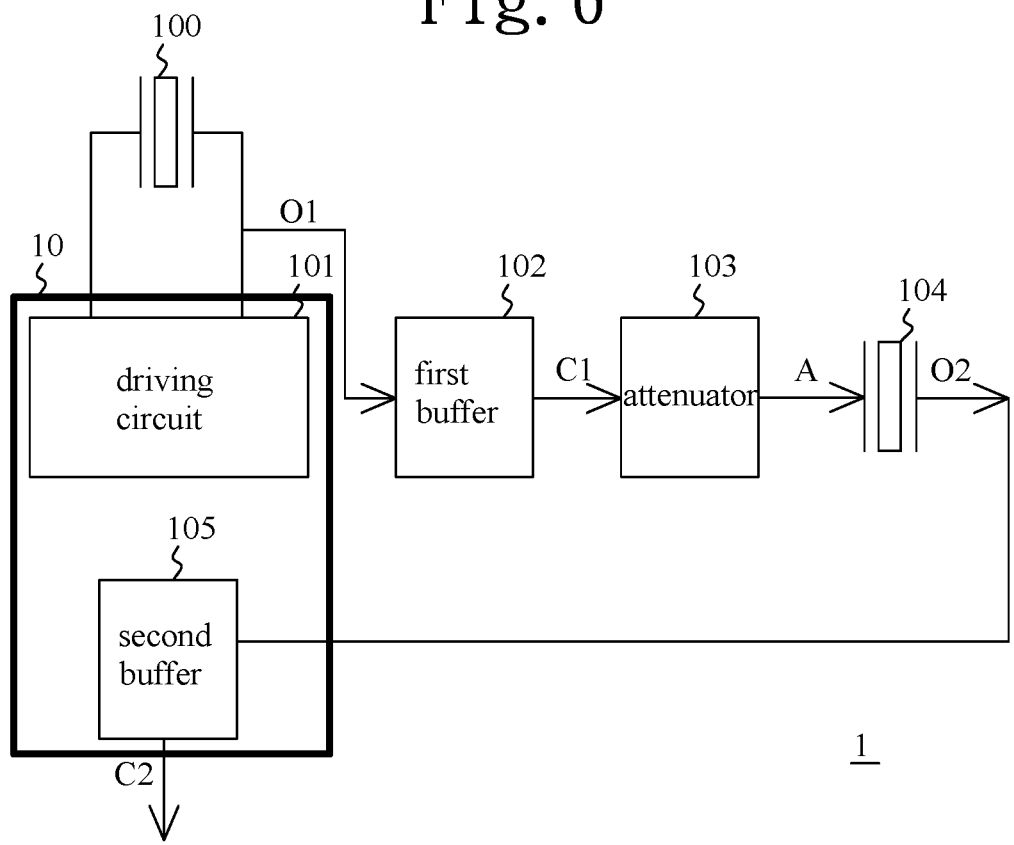
FIG. 7 is a diagram schematically illustrating an oscillating device according to a fifth embodiment of the present invention.

FIG. 7 is a diagram schematically illustrating an oscillating device according to a fifth embodiment of the present invention. Referring to FIG. 1 and FIG. 7, the driving circuit 101 and the second buffer 105 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

Figure 8:
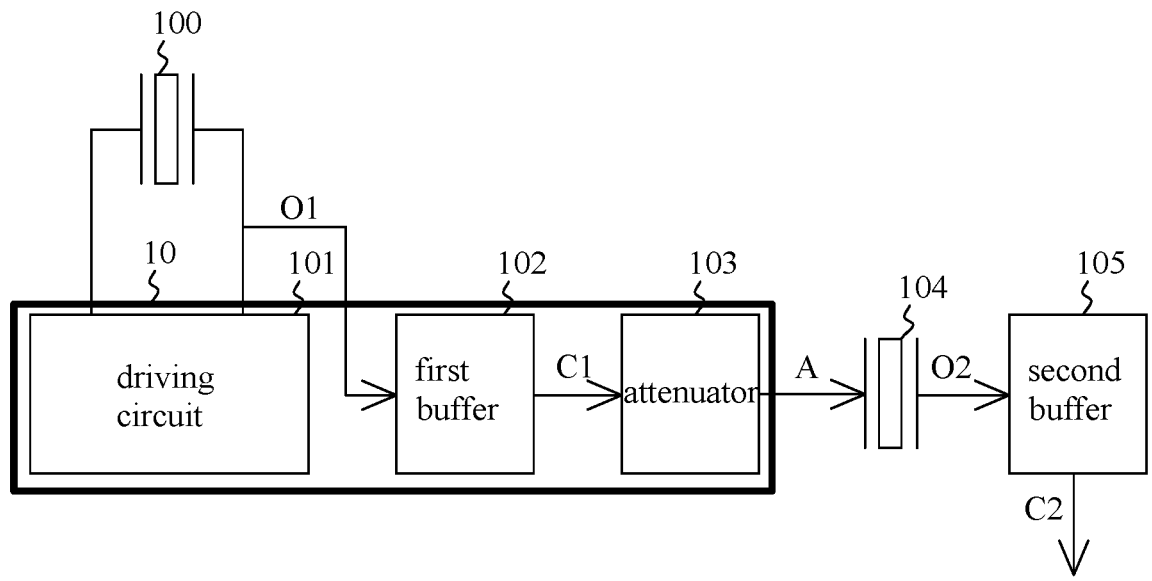
FIG. 8 is a diagram schematically illustrating an oscillating device according to a sixth embodiment of the present invention.

FIG. 8 is a diagram schematically illustrating an oscillating device according to a sixth embodiment of the present invention. Referring to FIG. 1 and FIG. 8, the driving circuit 101, the first buffer 102, and the attenuator 103 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

Figure 9:
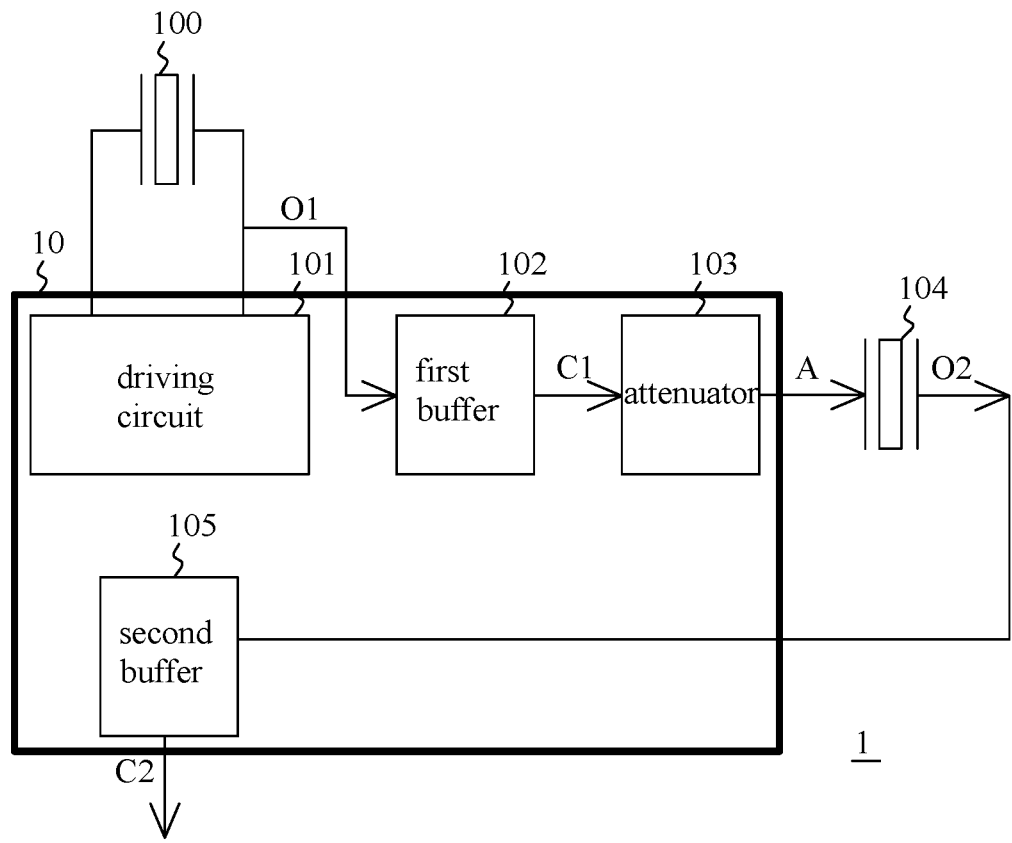
FIG. 9 is a diagram schematically illustrating an oscillating device according to a seventh embodiment of the present invention.

FIG. 9 is a diagram schematically illustrating an oscillating device according to a seventh embodiment of the present invention. Referring to FIG. 1 and FIG. 9, the driving circuit 101, the first buffer 102, the second buffer 105, and the attenuator 103 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

Figure 10:
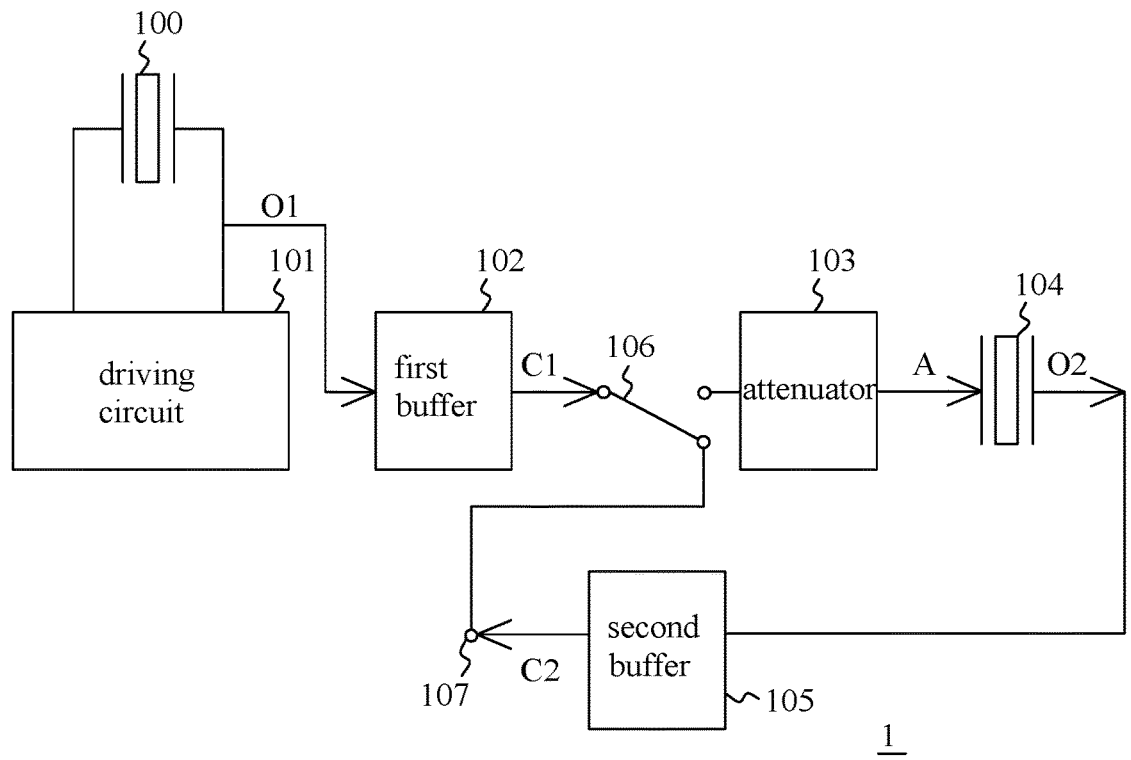
FIG. 10 is a diagram schematically illustrating an oscillating device according to an eighth embodiment of the present invention.

FIG. 10 is a diagram schematically illustrating an oscillating device according to an eighth embodiment of the present invention. Referring to FIG. 1 and FIG. 10, the eighth embodiment is different from the first embodiment in the eighth embodiment further includes an electric switch 106 with an end thereof coupled to the first buffer 102. Another end of the electric switch 106 is coupled to the attenuator 103 or an output terminal 107. The second buffer 105 is coupled to the output terminal 107. When the electric switch 106 connects the first buffer 102 to the attenuator 103 and disconnects the first buffer 102 from the output terminal 107, the attenuator 103 receives the first clock signal C1 through the electric switch 106 such that the second buffer 105 generates the second clock signal C2 received by the output terminal 107. When the electric switch 106 disconnects the first buffer 102 from the attenuator 103 and connects the first buffer 102 to the output terminal 107, the first buffer 102 transmits the first clock signal C1 to the output terminal 107 through the electric switch 106.

Figure 11:
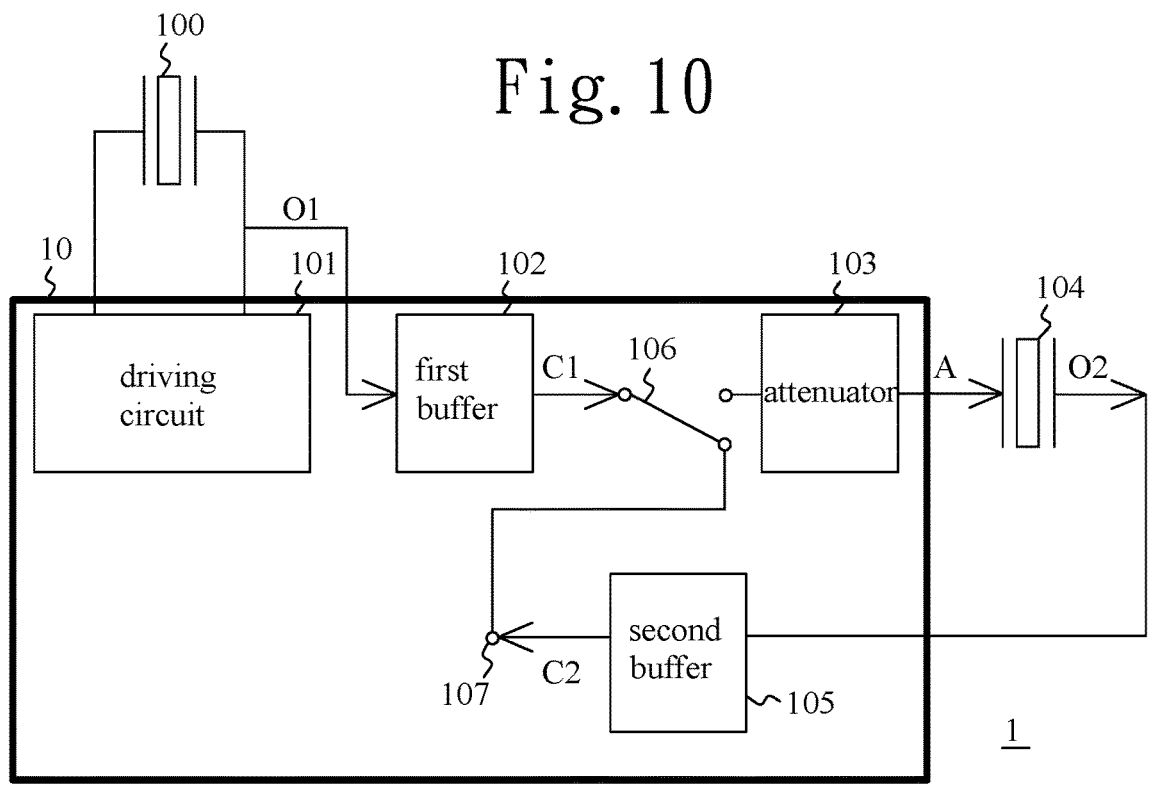
FIG. 11 is a diagram schematically illustrating an oscillating device according to a ninth embodiment of the present invention.

FIG. 11 is a diagram schematically illustrating an oscillating device according to a ninth embodiment of the present invention. Referring to FIG. 10 and FIG. 11, the driving circuit 101, the first buffer 102, the second buffer 105, the attenuator 103, and the electric switch 106 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

Figure 12:
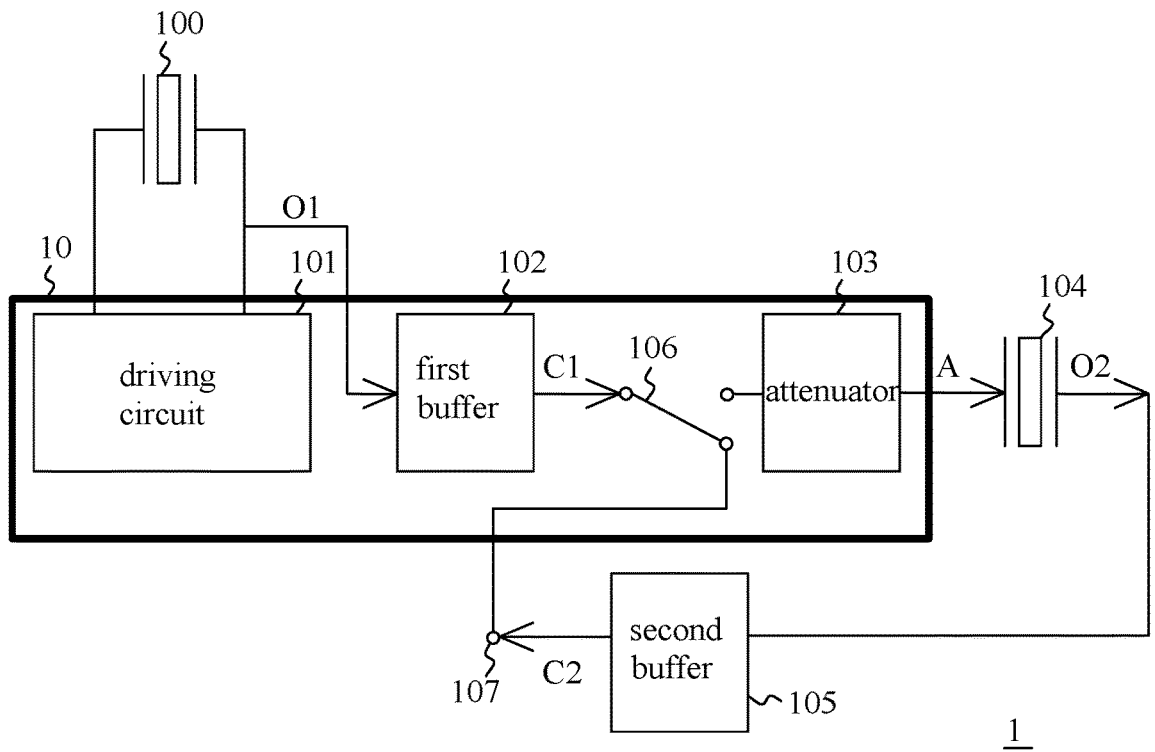
FIG. 12 is a diagram schematically illustrating an oscillating device according to a tenth embodiment of the present invention.

FIG. 12 is a diagram schematically illustrating an oscillating device according to a tenth embodiment of the present invention. Referring to FIG. 10 and FIG. 12, the driving circuit 101, the first buffer 102, the attenuator 103, and the electric switch 106 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

Figure 13:
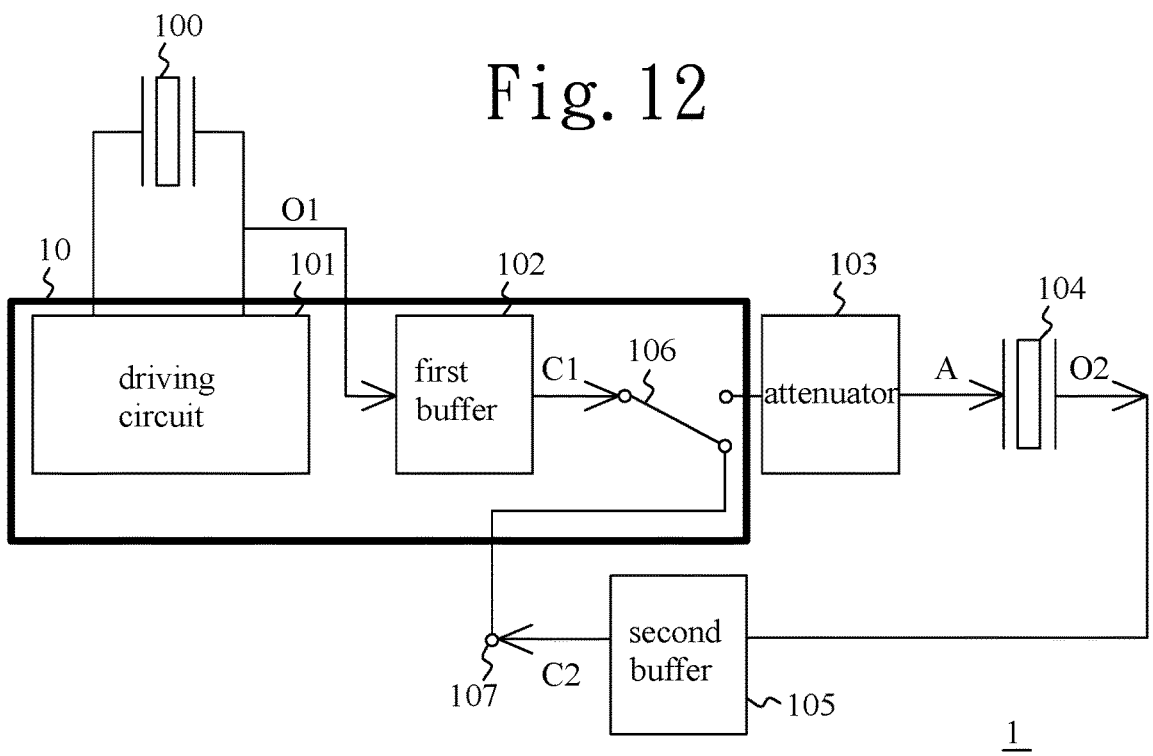
FIG. 13 is a diagram schematically illustrating an oscillating device according to an eleventh embodiment of the present invention.

FIG. 13 is a diagram schematically illustrating an oscillating device according to an eleventh embodiment of the present invention. Referring to FIG. 10 and FIG. 13, the driving circuit 101, the first buffer 102 and the electric switch 106 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO), but the present invention is not limited thereto.

According to the embodiments provided above, the oscillating device filters out the oscillating signal to generate a clear clock signal with two quartz crystal resonators, thereby reducing acceleration sensitivity and phase noise.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:
1. An oscillating device comprising:
a first quartz crystal resonator having a first resonant frequency;
a driving circuit coupled to the first quartz crystal resonator, wherein the driving circuit is configured to drive the first quartz crystal resonator to generate a first oscillating signal having the first resonant frequency;
a first buffer coupled to the driving circuit and the first quartz crystal resonator and configured to receive the first oscillating signal, wherein the first buffer is configured to isolate from a load variation behind the first quartz crystal and the driving circuit to generate a first clock signal in response to the first oscillating signal;
an attenuator coupled to the first buffer and configured to receive the first clock signal, wherein the attenuator is configured to reduce a wave swing of the first clock signal to generate an attenuated signal;
a second quartz crystal resonator, having a second resonant frequency, coupled to the attenuator and configured to receive and rectify the attenuated signal to generate a second oscillating signal having the second resonant frequency; and
a second buffer coupled to the second quartz crystal resonator and configured to receive the second oscillating signal, wherein the second buffer is configured to isolate from a load variation behind the first quartz crystal, the driving circuit, the attenuator, and the second quartz crystal resonator to generate a second clock signal in response to the second oscillating signal.

2. The oscillating device according to claim 1, wherein the driving circuit and the first buffer are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

3. The oscillating device according to claim 1, wherein the driving circuit, the first buffer, and the second buffer are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

4. The oscillating device according to claim 1, wherein the driving circuit is an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

5. The oscillating device according to claim 1, wherein the driving circuit and the second buffer are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

6. The oscillating device according to claim 1, wherein the driving circuit, the first buffer, and the attenuator are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

7. The oscillating device according to claim 1, wherein the driving circuit, the first buffer, the second buffer, and the attenuator are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

8. The oscillating device according to claim 1, further comprising an electric switch with an end thereof coupled to the first buffer and another end of the electric switch is coupled to the attenuator or an output terminal.

9. The oscillating device according to claim 8, wherein the driving circuit, the first buffer, the second buffer, the attenuator, and the electric switch are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

10. The oscillating device according to claim 8, wherein the driving circuit, the first buffer, the attenuator, and the electric switch are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

11. The oscillating device according to claim 8, wherein the driving circuit, the first buffer and the electric switch are integrated into an integrated circuit (IC) and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), or a Voltage Controlled Temperature Compensated Crystal Oscillator (VCTCXO).

\* \* \* \* \*